US 8,863,037 B2

(12) United States Patent
Moosavi

(10) Patent No.: US 8,863,037 B2
(45) Date of Patent: Oct. 14, 2014

(54) KEYPAD NAVIGATION SELECTION AND METHOD ON MOBILE DEVICE

(75) Inventor: Vahid Moosavi, Kitchener (CA)

(73) Assignee: Blackberry Limited, Waterloo (CA)

(*) Notice: Subject to any disclaimer, the term of this patent is extended or adjusted under 35 U.S.C. 154(b) by 1117 days.

(21) Appl. No.: 11/966,159

(22) Filed: Dec. 28, 2007

(65) Prior Publication Data

US 2009/0172604 A1 Jul. 2, 2009

(51) Int. Cl.
G06F 3/048 (2013.01)
G06F 3/0354 (2013.01)
G06F 3/023 (2006.01)
G06F 3/0488 (2013.01)
G06F 3/02 (2006.01)
H03K 17/96 (2006.01)

(52) U.S. Cl.
CPC .......... G06F 3/0488 (2013.01); G06F 3/03547 (2013.01); G06F 3/0237 (2013.01); G06F 3/04886 (2013.01); H03K 17/96 (2013.01); G06F 3/0202 (2013.01)
USPC ............ 715/856; 715/810; 715/850; 715/864

(58) Field of Classification Search
CPC ... G06F 3/04886; G06F 3/0237; G06F 3/041; G06F 3/04842; G06F 3/0488; G06F 3/04892; G06F 2203/04805; G06F 17/276
USPC .................. 715/864, 810, 850, 752; 345/173, 345/23–25
See application file for complete search history.

(56) References Cited

U.S. PATENT DOCUMENTS

| | | | |
|---|---|---|---|
| 6,292,179 B1 | 9/2001 | Lee | |
| 7,098,896 B2 * | 8/2006 | Kushler et al. | 345/168 |
| 7,286,115 B2 * | 10/2007 | Longe et al. | 345/168 |
| 7,542,029 B2 * | 6/2009 | Kushler | 345/168 |
| 7,656,317 B2 * | 2/2010 | Salman et al. | 341/23 |
| 7,821,503 B2 * | 10/2010 | Stephanick et al. | 345/173 |
| 2004/0021696 A1 | 2/2004 | Molgaard | |
| 2004/0120583 A1 * | 6/2004 | Zhai | 382/229 |
| 2004/0140956 A1 * | 7/2004 | Kushler et al. | 345/168 |
| 2005/0237228 A1 * | 10/2005 | Salman et al. | 341/22 |
| 2007/0046633 A1 | 3/2007 | Hirshberg | |
| 2007/0152978 A1 | 7/2007 | Kocienda | |
| 2007/0211034 A1 * | 9/2007 | Griffin et al. | 345/169 |
| 2008/0122658 A1 * | 5/2008 | Salman et al. | 341/22 |

FOREIGN PATENT DOCUMENTS

EP 1808744 A1 7/2007

OTHER PUBLICATIONS

Arnott et al.; Probabilistic Character disambiguation for Reduced Keyboards Using small Text Samples; © 1992; Dept. Math & Comp. Sci.; Univ of Dundee, Dundee, Tayside, Scotland; AAC Augmentative and Alternative Communication; 6 pages.*
Gong et al.; Alphabetically Contrained Keypaf Designs for Text Entry on Mobile Devices; ©2005; ACM; 10 pages.*
Search report of corresponding European Application: EP 07124126.9.

(Continued)

*Primary Examiner* — Linh K Pham
(74) *Attorney, Agent, or Firm* — Novak Druce Connolly Bove + Quigg LLP

(57) ABSTRACT

A handheld electronic communication device includes a plurality of text entry keys arranged in a keyfield. A user navigates among alphabetic selections shown on a display by moving his fingers across keys lying within a navigation travel region and otherwise generally used to effect text entry into the device.

29 Claims, 13 Drawing Sheets

(56) References Cited

OTHER PUBLICATIONS

Examination Report mailed Dec. 15, 2008. In corresponding application No. 07124126.9.
Canadian Office Action mailed Oct. 21, 2011. In corresponding application No. 2,642,191.
Summons to Attend Oral Proceedings pursuant to Rule 115(1) EPC mailed Jun. 12, 2009. In corresponding application No. 07124126.9.
Consultation by Telephone with the applicant/representative on Oct. 15, 2009. In corresponding application No. 07124126.9.
Decision to refuse a European patent application (Art. 97(2) EPC) on Nov. 3, 2009. In corresponding application No. 07124126.9.
Office Action mailed Oct. 19, 2012, in corresponding Canadian patent application No. 2,642,191.
Summons to oral proceedings pursuant to Rule 115(1) EPC mailed Feb. 18, 2013; in corresponding European patent application No. 07124126.9.
Office Action mailed Mar. 11, 2014; in corresponding Canadian patent application No. 2,642,191.

* cited by examiner

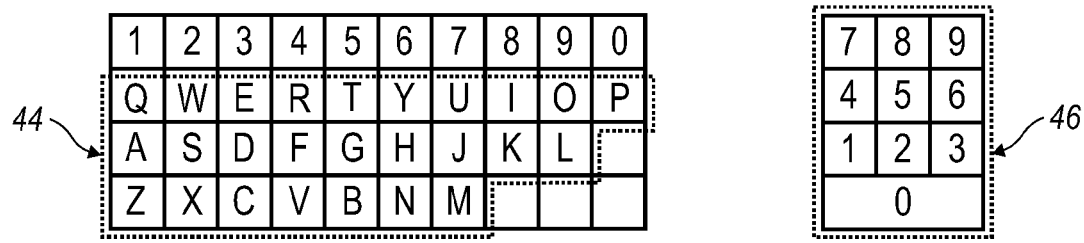
*FIG. 4*
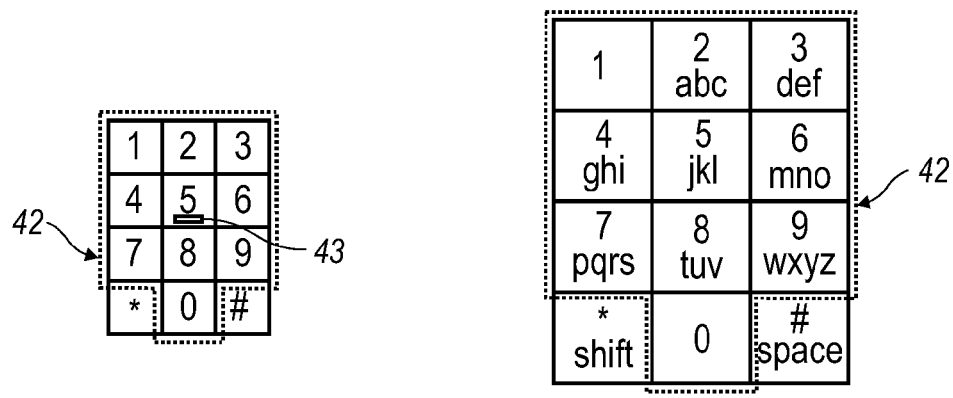
*FIG. 5*          *FIG. 6*

KEYPAD NAVIGATION SELECTION AND METHOD ON MOBILE DEVICE

FIELD

This disclosure, in a broad sense, relates to apparatus and methodology for navigating through alphabetic characters and words for selection by the user of mobile devices.

BACKGROUND

With the proliferation of wireless communication systems, compatible handheld communication devices are becoming more prevalent, as well as advanced. Whereas in the past such handheld communication devices were typically limited to either voice transmission (cell phones) or text transmission (pagers and PDAs), today's consumer often demands a multifunctional device capable of performing both types of transmissions, including even sending and receiving e-mail. Furthermore, these higher-performance devices can also be capable of sending and receiving other types of data including that which allows the viewing and use of Internet websites. These higher level functionalities necessarily require greater user interaction with the devices through included user interfaces (UIs) which may have originally been designed to accommodate making and receiving telephone calls and sending messages over a related Short Messaging Service (SMS). As might be expected, suppliers of such mobile communication devices and the related service providers are anxious to meet these customer requirements, but the demands of these more advanced functionalities have in many circumstances rendered the traditional user interfaces unsatisfactory, a situation that has caused designers to have to improve the UIs through which users input information and control these sophisticated operations.

Keyboards are used on many mobile devices, including Personal Digital Assistants (PDAs), telephones, and handheld wireless communication devices. The size of keyboards has been reduced over the years, as newer, smaller devices have become popular. Cell phones, for example, are now sized to fit in one's pocket or the palm of the hand. As the size of the devices has decreased, the more important it has become to utilize the entire keyboard surface as efficiently as possible.

Given the recent trend in keyboard miniaturization, the keypads of some reduced key keyboards may contain a fewer number of keys. As a result, the keys contained thereon may be assigned multiple alphanumeric characters. In such a case, mobile devices will often have a software routine or program which facilitates determining the desired key input. For example, if there are two characters on a particular key, depressing a key twice will affect the choosing of a particular character. Another methodology includes a disambiguation software, or predictive text routine, wherein after depressing a key having a plurality of characters associated therewith, a given character or combination of characters are displayed and the user can choose from among the character or combination of characters the desired input.

Additionally, in order to facilitate user control, many keyboards on mobile devices have an input device for navigation through the graphical user interface. Interfaces include such devices as trackballs and rotating wheels which can be used to effect movement of a cursor or pointer, or to scroll up, down and about a displayed page. These navigation devices often occupy a relatively large amount of space on the incorporating mobile device. Because the navigation device is frequently used and often requires fine control, a lower end size limitation will normally be observed by device designers. To accommodate such larger, more convenient navigation devices on the housing of the mobile device, the amount of space that is available for the keys of the keyboard is correspondingly reduced if the keyboard and navigational device are proximately located to one another.

Current solutions for cursor navigation and textual input require a substantial portion of the front face of a handheld electronic device to be dedicated to these input means while detracting from the space available for the display screen. Additionally, they require movement of a user's hand from the keypad to the navigational instrument to activate the navigational input means. Therefore, it is desirable to configure a handheld electronic device so that the space required for the input devices are minimized and user control regarding character input is improved.

BRIEF DESCRIPTION OF THE DRAWINGS

Exemplary methods and arrangements conducted and configured according to the advantageous solutions presented herein are depicted in the accompanying drawings wherein:

FIG. 3A illustrates an exemplary QWERTY keyboard layout;

FIG. 3B illustrates an exemplary QWERTZ keyboard layout;

FIG. 3C illustrates an exemplary AZERTY keyboard layout;

FIG. 3D illustrates an exemplary Dvorak keyboard layout;

FIG. 4 illustrates a QWERTY keyboard layout paired with a traditional ten-key keyboard;

FIG. 5 illustrates ten digits comprising the numerals 0-9 arranged in a traditional, ITU Standard E.161 numeric telephone keypad layout, including the * and # keys flanking the 0 key;

FIG. 6 illustrates a traditional or standard phone key arrangement or layout according to the ITU Standards E.161 including both numerals and letters;

DETAILED DESCRIPTION

Figure 1A:
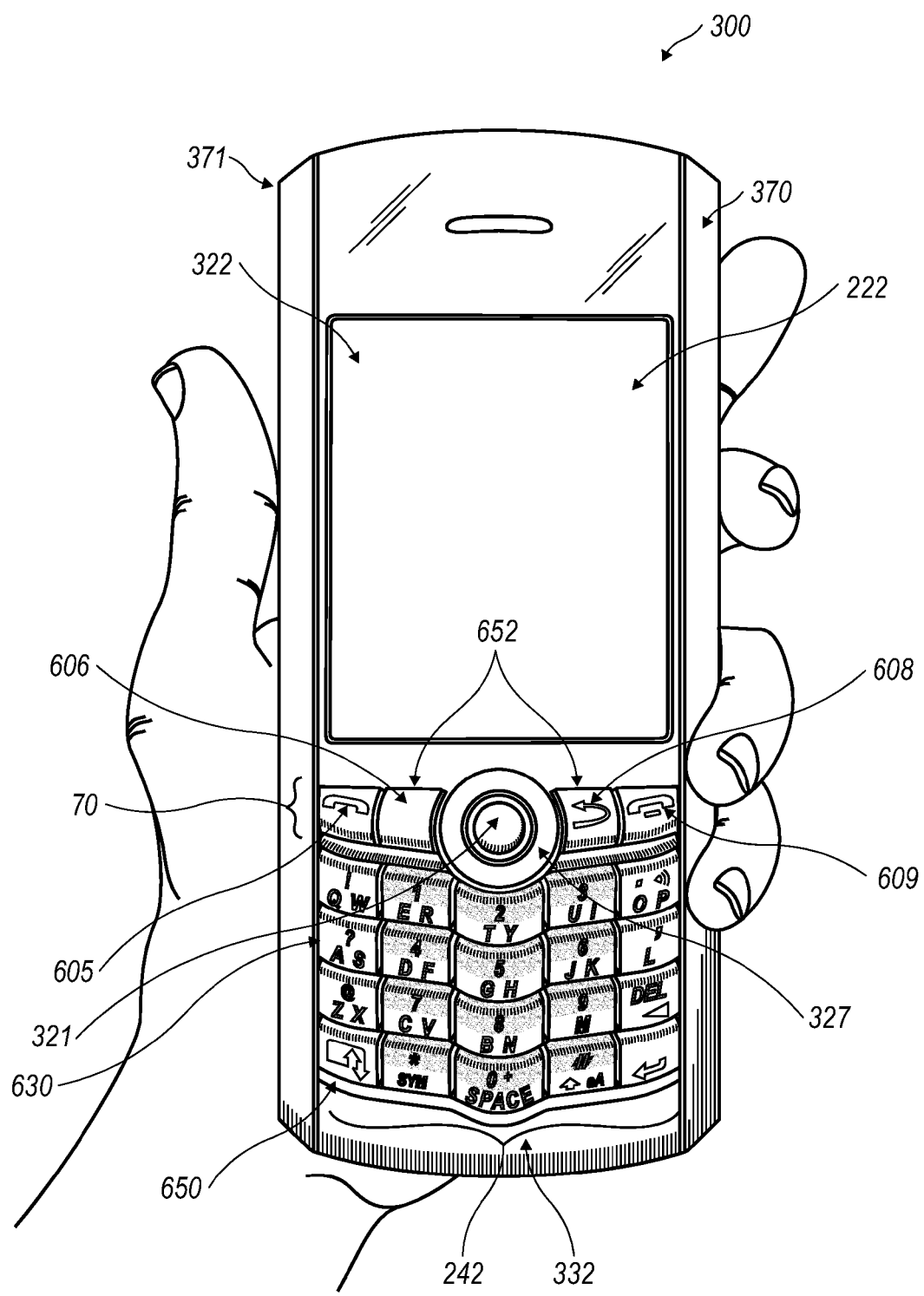
FIG. 1A illustrates a handheld wireless communication device configured according to the present teachings cradled in the palm of a user's hand.
Figure 2:
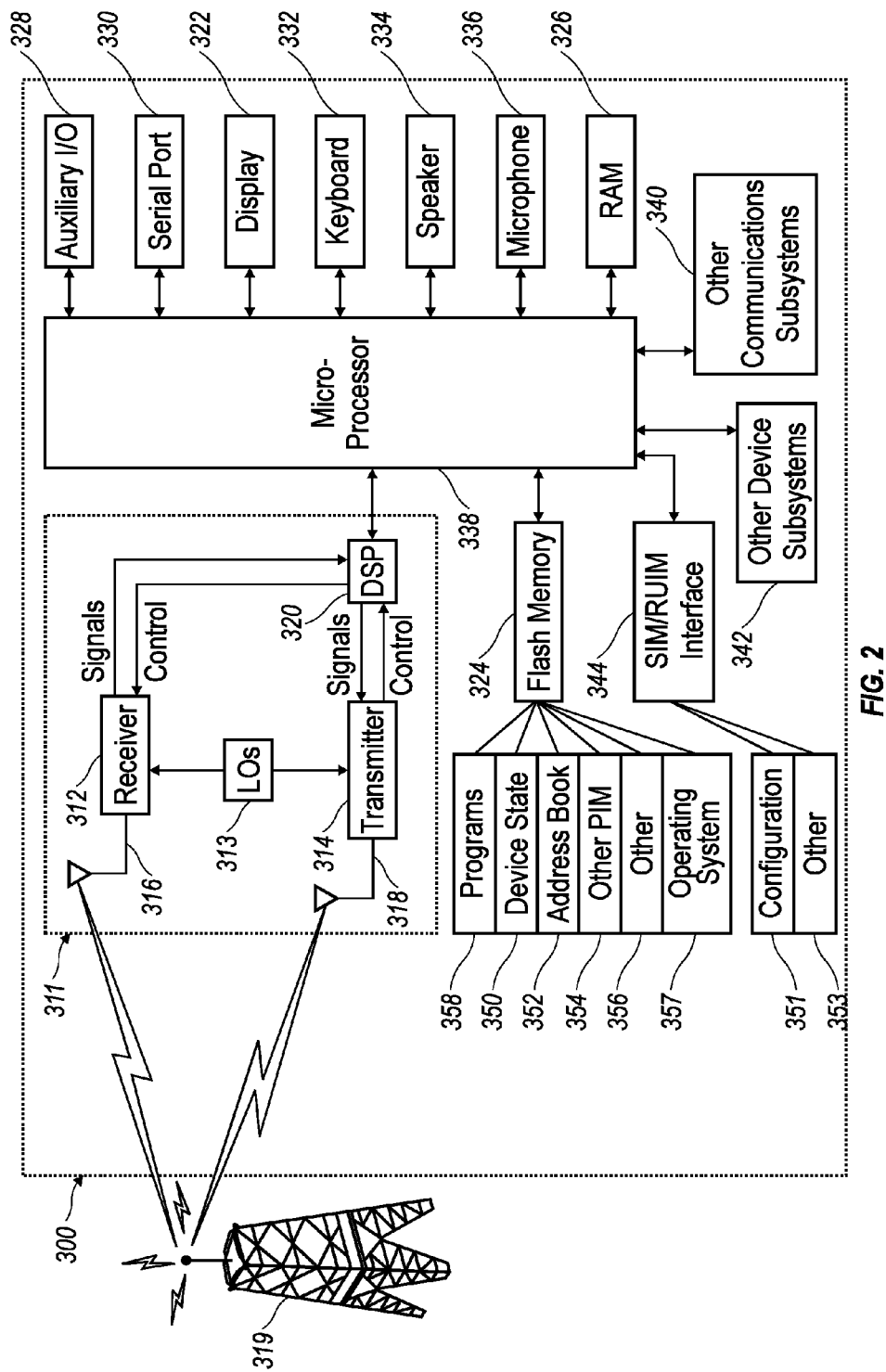
FIG. 2 is a block diagram representing a wireless handheld communication device interacting in a communication network.

An exemplary handheld wireless communication device 300 is shown in FIG. 1A, and the device's cooperation in a wireless network 319 is exemplified in the block diagram of FIG. 2. These figures are exemplary only, and those persons skilled in the art will appreciate the additional elements and modifications necessary to make the device 300 work in particular network environments. While the following exemplary embodiments are described in connection with handheld wireless communication devices, it can be appreciated by those skilled in the art that these embodiments can also be implemented in other mobile devices such as PDAs, or the like.

As shown in the block diagram of FIG. 2, the handheld device 300 includes a microprocessor 338 that controls the operation of the device 300. A communication subsystem 311 performs all communication transmission and reception with the wireless network 319. The microprocessor 338 further connects with an auxiliary input/output (I/O) subsystem 328, a serial port (preferably a Universal Serial Bus port) 330, a display 322, a keyboard 332, a speaker 334, a microphone 336, random access memory (RAM) 326, and flash memory 324. Other communication subsystems 340 and other device subsystems 342 are generally indicated as being functionally connected with the microprocessor 338 as well. An example of a communication subsystem 340 is that of a short range communication system such as BLUETOOTH® communication module or a Wi-Fi communication module (a communication module in compliance with IEEE 802.11b) and associated circuits and components. Additionally, the microprocessor 338 is able to perform operating system functions and preferably enables execution of software applications on the handheld wireless communication device 300.

Figure 1B:
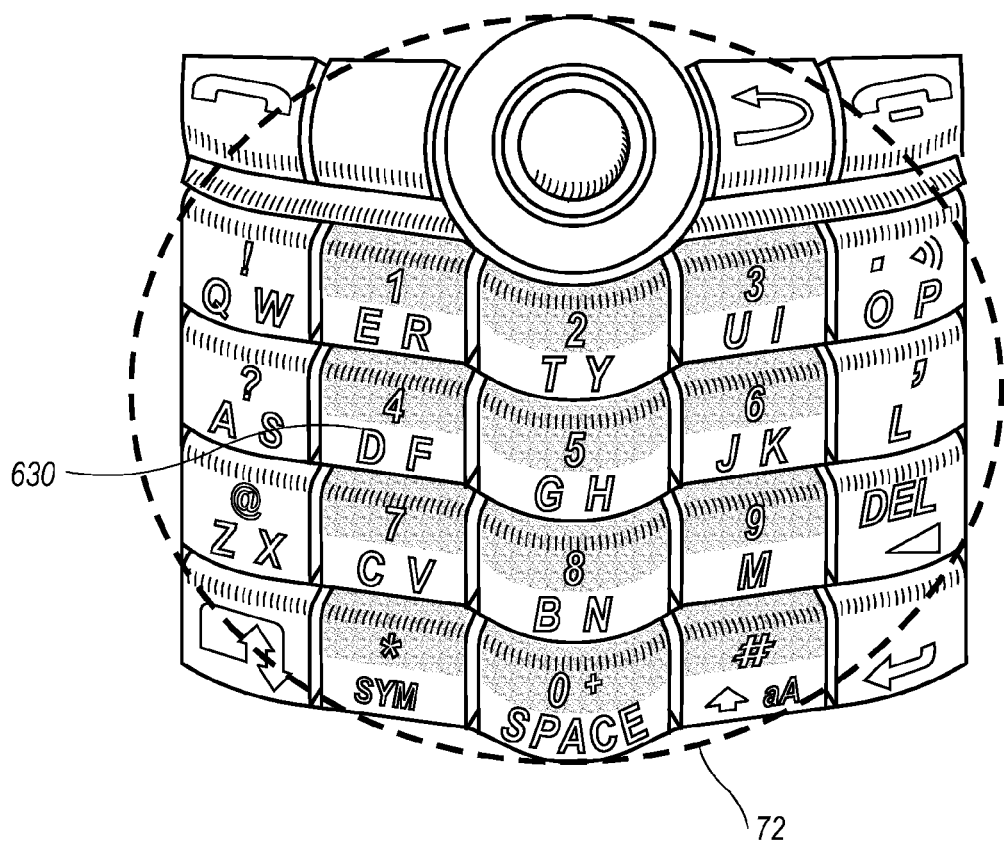
FIG. 1B is a close-up of the keyfield employed on the handheld wireless communication device of FIG. 1A.

As will be explained more fully below, at least one auxiliary input subsystem 328 according to this disclosure can be integrated with the keyfield area 650 that is generally used for text entry, as illustrated in FIGS. 1A and 1B. In this embodiment, the auxiliary input subsystem 328 has a cursor navigation area 72 through which the user moves his finger to control motion of a cursor, pointer, icon, menu highlighting or the like across the display screen 322 of the device 300. The cursor navigation area 72 can be defined by a capacitance sensitive sheet capable of sensing sweeping motion executed proximate thereto. The cursor navigation area 72 can underlay or overlie a number of, and preferably all the alphabetic input keys 630 of the keyfield area 650 on the device 300. Thus, the user navigates by dragging his fingertip over the keys of the keyfield area 650 that are otherwise—generally, as referenced below—used for text entry. The user can initiate navigation a number of ways, as will be further discussed below, for example by moving in an uninterrupted sweeping contact motion after contacting any key, or specific keys. Such sweeping motion in a particular direction indicates to the device microprocessor 338 that the user is navigating. The microprocessor 338 is programmed to interpret cursor guidance instructions from sweeping contact motion that initiates after depressing a letter input key and without disengaging the finger from the actuated key. As the sweeping motion continues across the cursor navigation area 72, the microprocessor 338 is configured to receive cursor guidance instructions via the cursor navigation area 72 and to cause corresponding cursor movement or selection of character(s) (for example by highlighting) on the display screen 322 of the display area 222. Thus, according to at least one of the exemplary embodiments described herein, the microprocessor 338 receives input data indicative of detected contact with a particular input key 630 that uninterruptedly continues as sweeping motion across the cursor navigation area 72. A software program running on the microprocessor 338 can process input data and transmit instructional data to the display screen 322.

Furthermore, the microprocessor 338 is programmed to interpret text input instructions from contact that initiates at an alphabetic input key 630. The device 300 can be configured such that navigation is terminated in a variety of ways, including by merely stopping the sweeping contact motion or depressing an actuable key after executing such a sweeping motion across keyfield area 650. Also, as can be seen by the above described embodiments the microprocessor 338 is communicatively connected between the alphabetic input keys 630 and the display screen 322 of the display area 222. Furthermore, the microprocessor can be communicatively connected between the cursor navigation area 72 and the display screen 322.

The keys of the keyfield area 650 (particularly in the case of physical keys) may be configured with dual means of actuation—one means of actuation provided for navigation and the other means of actuation provided for text entry. For example, the keyfield area 650 keys may have both soft-touch functionality for navigation (for example, by capacitance, resistive, surface acoustic wave (SAW) detectors or pressure sensors) and hard-press functionality for text entry (for example, by dome switches). Alternatively, the keys of the keyfield area 650 may be constructed with just a single input modality. For example, the keys may be flush with the surface of the handheld device 300 and register actuation through capacitance or surface wave detectors. In yet another embodiment, the keys may be provided as "virtual" keys on a touch sensitive display screen and be actuated using the technology associated with the touch screen technology of the incorporating display screen.

As may be appreciated from FIG. 1A, one embodiment of a handheld wireless communication device 300 comprises a display screen 322 located above a keyboard 332 constituting a user input and suitable for accommodating both textual input and navigational input to the handheld wireless communication device 300. The handheld device 300 includes a hand cradleable body 371 configured to be held in one hand by an operator of the device during text entry. The keyfield area 650 is located at the front face 370 of the device 300 and may, as shown in FIGS. 1A and 1B, include alphabetic keys 630. The keys of the keyfield area 650 may be physically depressible. Moreover, as shown in FIGS. 1A and 1B, the keys may form a reduced keyboard configuration, in which multiple alphabetic characters are associated with at least one of the keys. Regardless of whether the keyboard 332 is of a reduced or full configuration, the order of the letters of the alphabetic keys 630 are preferably arranged in a standard keyboard order such as QWERTY, QWERTZ, and the like. This terminology has been utilized to delineate the fact that such a telephone keypad as depicted in FIG. 6 may not allow for efficient text entry on the handheld device 300.

Keys, typically of a push-button or push-pad nature, perform well as data entry devices but present problems to the user when they must also be used to effect navigational control over a screen-cursor. In order to solve this problem the present handheld wireless communication device 300 preferably includes an auxiliary input that acts as a cursor navigation tool and which is also exteriorly located upon the front face 370 of the device 300. Its front face location is particularly advantageous because it makes the tool easily thumb-actuable like the keys of the keyboard. A particularly usable embodiment provides the navigation tool in the form of a trackball 321 which is easily utilized to instruct two-dimensional screen cursor movement in substantially any direction, as well as act as an actuator when the trackball 321 is depressed like a button. The placement of the navigation tool 327 is preferably above the keyboard 332 and below the display screen 322; here, it avoids interference during keyboarding and does not block the user's view of the display screen 322 during use. (See FIG. 1A).

The handheld wireless communication device 300 is also configured to send and receive voice communications such as mobile telephone calls, in addition text messages. To facilitate telephone calls, two call keys 605, 609 ("outer keys") are provided in the upper, navigation row 70 (so-called because it includes the navigation tool 327) at the outer ends of the navigation row 70. One of the two call keys is a call initiation key 605, and the other is a call termination key 609. The navigation row 70 also includes another pair of keys ("flanking keys") that are located immediately adjacent to the navigation tool 327, with one flanking key on either side of the navigation tool 327. It is noted that the outer keys are referred to as such not because they are necessarily the outermost keys in the navigation row—there may be additional keys located even further outwardly of the outer keys if desired—but rather because they are located outwardly with respect to the flanking keys. The flanking keys may, for instance, constitute the menu keys 652, which include a menu call-up key 606 and an escape or back key 608. The menu call-up key 606 is used to bring up a menu on the display screen 322 and the escape key 608 is used to return to the previous screen or previous menu selection. The functions of the call keys and the menu keys may, of course, be provided by buttons that are located elsewhere on the handheld device 300, with different functions assigned to the outer keys and the flanking keys.

Furthermore, the handheld device 300 is equipped with components to enable operation of various programs, as shown in FIG. 2. In an exemplary embodiment, the flash memory 324 is enabled to provide a storage location for the operating system 357, device programs 358, and data. The operating system 357 is generally configured to manage other application programs 358 that are also stored in memory 324 and executable on the processor 338. The operating system 357 honors requests for services made by application programs 358 through predefined application program 358 interfaces. More specifically, the operating system 357 typically determines the order in which multiple applications 358 are executed on the processor 338 and the execution time allotted for each application 358, manages the sharing of memory 324 among multiple applications 358, handles input and output to and from other device subsystems 342, and so on. In addition, users can typically interact directly with the operating system 357 through a user interface usually including the keyboard 332 and display screen 322. While in an exemplary embodiment the operating system 357 is stored in flash memory 324, the operating system 357 in other embodiments is stored in read-only memory (ROM) or similar storage element (not shown). As those skilled in the art will appreciate, the operating system 357, device application 358 or parts thereof may be loaded in RAM 326 or other volatile memory.

In one exemplary embodiment, the flash memory 324 contains programs/applications 358 for execution on the handheld device 300 including an address book 352, a personal information manager (PIM) 354, and the device state 350. Furthermore, programs 358 and other information 356 including data can be segregated upon storage in the flash memory 324 of the handheld device 300.

When the handheld device 300 is enabled for two-way communication within the wireless communication network 319, it can send and receive signals from a mobile communication service. Examples of communication systems enabled for two-way communication include, but are not limited to, the General Packet Radio Service (GPRS) network, the Universal Mobile Telecommunication Service (UMTS) network, the Enhanced Data for Global Evolution (EDGE) network, and the Code Division Multiple Access (CDMA) network and those networks, generally described as packet-switched, narrowband, data-only technologies which are mainly used for short burst wireless data transfer. For the systems listed above, the handheld wireless communication device 300 must be properly enabled to transmit and receive signals from the communication network 319. Other systems may not require such identifying information. GPRS, UMTS, and EDGE require the use of a Subscriber Identity Module (SIM) in order to allow communication with the communication network 319. Likewise, most CDMA systems require the use of a Removable Identity Module (RUIM) in order to communicate with the CDMA network. The RUIM and SIM card can be used in multiple different communication devices 300. The handheld communication device 300 may be able to operate some features without a SIM/RUIM card, but it will not be able to communicate with the network 319. A SIM/RUIM interface 344 located within the device 300 allows for removal or insertion of a SIM/RUIM card (not shown). The SIM/RUIM card features memory and holds key configurations 351, and other information 353 such as identification and subscriber related information. With a properly enabled communication device 300, two-way communication between the handheld wireless communication device 300 and communication network 319 is possible.

If the handheld wireless communication device 300 is enabled as described above or the communication network 319 does not require such enablement, the two-way communication enabled handheld device 300 is able to both transmit and receive information from the communication network 319. The transfer of communication can be from the handheld device 300 or to the device 300. In order to communicate with the communication network 319, the handheld device 300 in the presently described exemplary embodiment is equipped with an integral or internal antenna 318 for transmitting signals to the communication network 319. Likewise the handheld wireless communication device 300 in the presently described exemplary embodiment is equipped with another antenna 316 for receiving communication from the communication network 319. These antennae (316, 318) in another exemplary embodiment are combined into a single antenna (not shown). As one skilled in the art would appreciate, the antenna or antennae (316, 318) in another embodiment are externally mounted on the handheld device 300.

When equipped for two-way communication, the handheld wireless communication device 300 features a communication subsystem 311. As is well known in the art, this communication subsystem 311 is modified so that it can support the operational needs of the handheld device 300. The subsystem 311 includes a transmitter 314 and receiver 312 including the associated antenna or antennae (316, 318) as described above, local oscillators (LOs) 313, and a processing module 320 which in the presently described exemplary embodiment is a digital signal processor (DSP) 320.

It is contemplated that communication by the handheld device 300 with the wireless network 319 can be any type of communication that both the wireless network 319 and handheld device 300 are enabled to transmit, receive and process. In general, these can be classified as voice and data. Voice communication is communication in which signals for audible sounds are transmitted by the handheld device 300 through the communication network 319. Data is all other types of communication that the handheld device 300 is capable of performing within the constraints of the wireless network 319.

Example device applications that can depend on such data include email, contacts and calendars. For each such application synchronization with home-based versions on the applications can be critical for either or both of their long term and short term utility. As an example, emails are often time sensitive, so substantially real time synchronization is highly desirable. Contacts, on the other hand, can be usually updated less frequently without inconvenience. Therefore, the utility of the handheld device 300 is significantly enhanced (if not enabled) when connectable within a communication system, and particularly when connectable on a wireless basis in a network 319 in which voice, text messaging, and other data transfer are accommodated.

As intimated hereinabove, one of the more important aspects of the handheld wireless communication device 300 to which this disclosure is directed is its size. While some users will grasp the handheld device 300 in both hands, it is intended that a predominance of users will cradle the handheld device 300 in one hand in such a manner that input and control over the handheld device 300 can be effected using the thumb of the same hand in which the handheld device 300 is held. However, it is appreciated that additional control can be effected by using both hands. As a handheld device 300 that is easy to grasp and desirably pocketable, the size of the handheld device 300 must be kept commensurately small. Of the device's dimensions, limiting its width is important for the purpose of assuring cradleability in a user's hand. Moreover, it is preferred that the width of the handheld device 300 be maintained at less than eight centimeters (approximately three inches). Keeping the handheld device 300 within these dimensional limits provides a hand cradleable unit that users prefer for its usability and portability. Limitations with respect to the height (length) of the handheld device 300 are less stringent when considering hand-cradleability. Therefore, in order to gain greater size, the handheld device 300 can be advantageously elongated so that its height is greater than its width, but still remains easily supported and operated in one hand.

A potential drawback is presented by the small size of the handheld device 300 in that there is limited exterior surface area for the inclusion of user input and device output features. This is especially true for the "prime real estate" on the front face 370 of the handheld device 300, where it is most advantageous to include a display screen 322 that outputs information to the user. The display screen 322 is preferably located above a keyboard 332 that is utilized for data entry into the handheld device 300 by the user. If the screen 322 is provided below the keyboard 332, a problem occurs in that viewing the screen 322 is inhibited when the user is inputting data using the keyboard 332. Therefore it is preferred that the display screen 322 be above the input area, thereby solving the problem by assuring that the hands and fingers do not block the view of the screen 322 during data entry periods.

To facilitate textual data entry into the handheld device 300, an alphabetic keyboard 332 is provided. In the exemplary illustrated embodiment, a reduced format alphabetic keyboard 332 is utilized in which there are multiple letters associated with at least some of the keys (with some of the letter keys also having numbers, symbols, or functions associated with them). In this regard, the letter indicia associated with the alphabetic keys can be advantageously organized in QWERTY, QWERTZ, AZERTY, or Dvorak layouts, among others, thereby capitalizing on certain users' familiarity with these various letter orders. An exemplary arrangement 242 is shown in FIGS. 1A and 1B.

As shown in FIG. 1A, the handheld wireless communication device 300 is cradleable in the palm of a user's hand. The handheld device 300 is provided with a keyboard 332 to enter text data and place telephone calls and a display screen 322 for communicating information to the user. A connect/send key 605 is preferably provided to aid in the placement of a phone call. Additionally, a disconnect/end key 609 is provided. The send key 605 and end key 609 preferably are located at the upper left and right corners of the keyfield, as shown, although many other locations may be utilized.

The keyboard 332 includes a plurality of keys that can be of a physically depressible nature such as actuable buttons, or they can be of a software nature, typically constituted by virtual representations of physical keys on a display screen 322 (referred to herein as "virtual keys"). It is also contemplated that the user input can be provided as a combination of the two types of keys. Each key of the plurality of keys has at least one actuable action which can be the input of a character, a command or a function. In this context, "characters" are contemplated to exemplarily include alphabetic letters, language symbols, numbers, punctuation, insignias, icons, pictures, and even a blank space. Input commands and functions can include such things as delete, backspace, moving a cursor up, down, left or right, initiating an arithmetic function or command, initiating a command or function specific to an application program or feature in use, initiating a command or function programmed by the user and other such commands and functions that are well known to those persons skilled in the art. Further, depending on the application 358 or feature in use, specific keys can be enabled or disabled.

In the case of physical keys, all or a portion of the plurality of keys have one or more indicia representing character(s), command(s), functions(s), or a combination including one or more of character(s), command(s), and function(s) displayed at on one or more of their top surface (as illustrated in FIGS. 1 and 1A) and on the surface of the area adjacent the respective key. In the instance where the indicia of a key's function is provided adjacent the key, the indicia can be printed on the device cover beside the key, or in the instance of keys located adjacent the display screen 322. Additionally, current indicia for the key may be temporarily shown nearby the key on the screen 322.

In the case of virtual keys, the indicia for the respective keys are shown on the display screen 322, which in one embodiment each virtual key has a contact-sensitive top surface and is enabled by touching the display screen 322, for example, with a stylus to generate the character or activate the indicated command or function. Some examples of display screens 322 capable of detecting a touch include resistive, capacitive, projected capacitive, infrared and surface acoustic wave (SAW) touchscreens. The virtual keys are generally non-depressible keys, and are visually defined over the capacitance sensitive sheet.

Physical and virtual keys can be combined in many different ways as appreciated by those skilled in the art. In one embodiment, physical and virtual keys are combined such that the plurality of enabled keys for a particular application or feature of the handheld wireless communication device 300 is shown on the display screen 322 in the same configuration as the physical keys. Using this configuration, the user can select the appropriate physical key corresponding to what is shown on the display screen 322. Thus, the desired character, command or function is obtained by depressing the physical key corresponding to the character, command or function displayed at a corresponding position on the display screen 322, rather than touching the display screen 322.

Figures 3A, 3B, 3C, 3D:
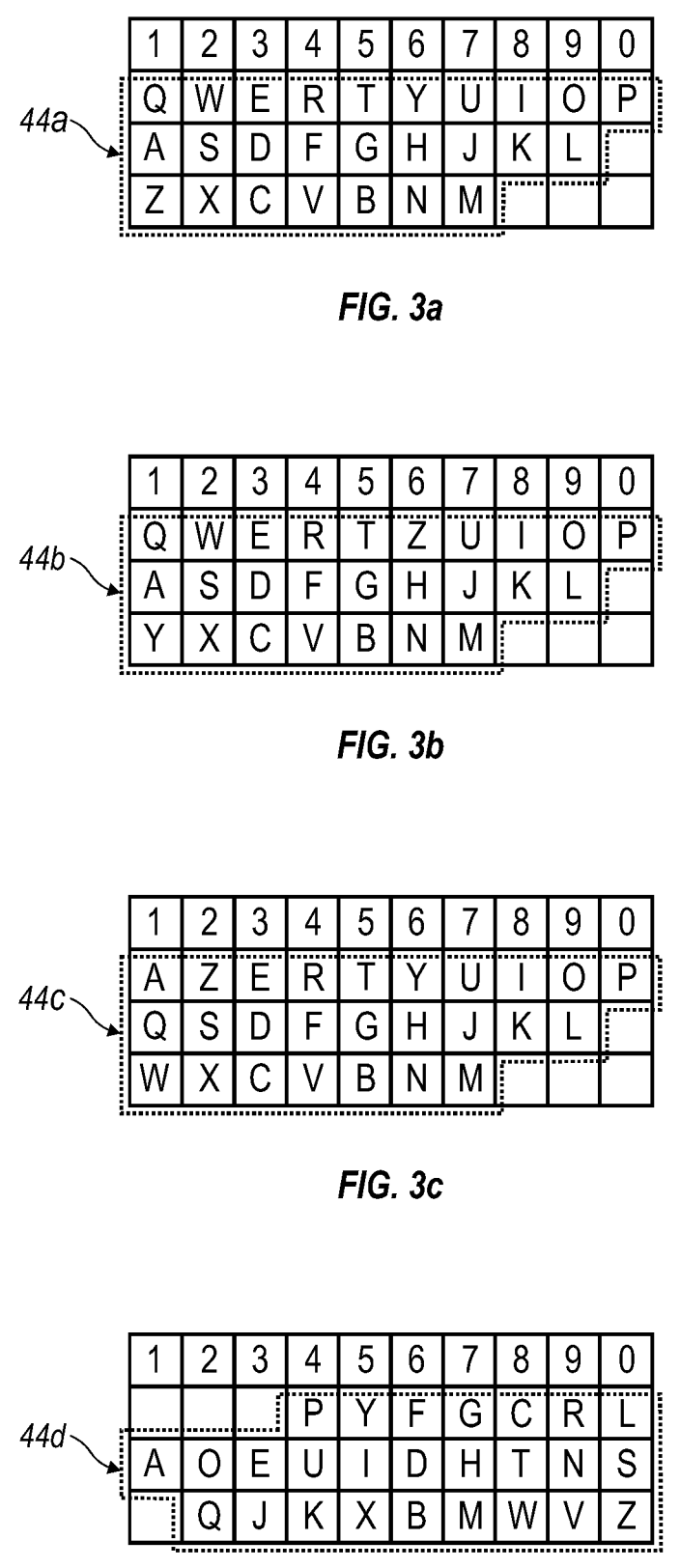

The various characters, commands, and functions associated with keyboard typing in general are traditionally arranged using various conventions. The most common of these in the United States, for instance, is the QWERTY keyboard layout. Others include the QWERTZ, AZERTY, and Dvorak keyboard configurations. The QWERTY keyboard layout is the standard English-language alphabetic key arrangement 44*a* shown in FIG. 3A and is employed in the exemplary embodiment illustrated in FIG. 1A. The QWERTZ keyboard layout is normally used in German-speaking regions; this alphabetic key arrangement 44*b* is shown in FIG. 3B. The AZERTY keyboard layout 44*c* is normally used in French-speaking regions and is shown in FIG. 3C. The Dvorak keyboard layout was designed to allow typists to type faster; this alphabetic key arrangement 44*d* is shown in FIG. 3D. In other exemplary embodiments, keyboards having multi-language key arrangements can be implemented.

Alphabetic key arrangements are often presented along with numeric key arrangements. Typically, the numbers 1-9 and 0 are positioned in the row above the alphabetic keys 44*a-d*, as shown in FIG. 3A-D. Alternatively, the numbers share keys with the alphabetic characters, such as the top row of the QWERTY keyboard. Yet another exemplary numeric key arrangement is shown in FIG. 4, where a "ten-key" style numeric keypad 46 is provided on a separate set of keys that is spaced from the alphabetic/numeric key arrangement 44. Further, a numeric phone key arrangement 242 is exemplarily illustrated in FIGS. 1A and 1B.

As shown in FIG. 5, the numeric phone key arrangement 42 may also utilize a surface treatment on the surface of the "5" key. This surface treatment is configured such that the top surface of the key is distinctive from the surface of other keys. Preferably the surface treatment is in the form of a raised bump or recessed dimple 43. Alternatively, raised bumps may be positioned on the housing 76 around the "5" key and do not necessarily have to be positioned directly on the key.

It is desirable for handheld devices 300 to include a combined text-entry keyboard and a telephony keyboard, as illustrated in FIGS. 1A and 1B. Examples of such handheld devices 300 include mobile stations, cellular telephones, wireless personal digital assistants (PDAs), two-way paging devices, and others. Various keyboard arrangements can be used with such devices and can be termed a full keyboard, a reduced-format keyboard (as illustrated), or phone key pad. In embodiments of a handheld device 300 having a full keyboard, the alphabetic characters are singly associated with the plurality of physical keys. Thus, in an English-language keyboard of this configuration, there would be at least 26 keys in the plurality, with one letter per alphabetic key.

FIGS. 5 and 6 both feature numeric keys arranged according to the ITU Standard E.161 form. In addition, FIG. 6 also incorporates alphabetic characters according to the ITU Standard E.161 layout as well. The International Telecommunications Union ("ITU") has established phone standards for the arrangement of alphanumeric keys. The standard phone numeric key arrangement shown in FIGS. 5 (no alphabetic letters) and 6 (with alphabetic letters) corresponds to ITU Standard E.161, entitled "Arrangement of Digits, Letters, and Symbols on Telephones and Other Devices That Can Be Used for Gaining Access to a Telephone Network." This standard is also known as ANSI TI.703-1995/1999 and ISO/IEC 9995-8:1994. As shown in FIGS. 1A and 1B the numeric key arrangement can be overlaid on a QWERTY arrangement. The numeric arrangement as shown can be aptly described as a top-to-bottom ascending order three-by-three-over-zero pattern.

While several keyboard layouts have been described above, the layouts can be described as having keys disposed on the keyboard in a QWERTY, reduced QWERTY, QWERTZ, Dvorak, or AZERTY key layout. These familiar keyboard layouts allow users to type more intuitively and quickly than, for example, on the standard alphabetic layout on a telephone pad. As mentioned above, the key arrangements can be reduced compared to a standard layout through the use of more than one letter or character per key. By utilizing fewer keys, the keys can be made larger and therefore more convenient to the user.

Alternate arrangements for navigating and selecting characters displayed on a handheld wireless device 300 are disclosed in FIGS. 1A, 1B, 7A-7E, and 8A-8B. As summarized above, an exemplary keyboard arrangement includes alphabetic keys 630 forming at least a portion of keyfield area 650 and cursor navigation area 72 across which the user moves his finger to control the motion of a cursor, pointer, icon, menu highlighting or the like about the display screen 322 of the device 300. The cursor navigation area 72 is located relative (overlies or underlays, for example) a number of the text entry keyfield keys on the device 300. The cursor navigation area 72 is illustrated in FIG. 1B with broken lines to indicate that its bounds may vary in size, for example, depending on the application being run on the device, size of the keyfield area 650 and the like. The cursor navigation area 72 may be coincident with a plurality of engageable alphabetic input keys 630, or all alphabetic input keys 630 in the keyfield area 650 relative the front face of the device 300. In some embodiments, at least a portion of the alphabetic input keys 630 have a plurality of alphabetic keys associated therewith. Alternatively, the plurality of input keys can be physically depressible keys with a contact-sensitive top surface. In operation of the device 300, the user navigates through elements displayed on the screen 322 by moving his finger or other object (for example a stylus) or digit across the keys of the keyfield area 650 to control motion of a cursor, pointer, icon, menu item highlighter or the like. The keys of the keyfield area 650 can also be used for text entry to select an associated alphabetic character, character combination or word displayed on screen 322.

In at least one embodiment as shown in FIGS. 7A-7E, the cursor navigation area 72 (see FIG. 1B) can be utilized to facilitate selection of an alphabetic character, combination of characters, words, or predictive characters or words. As shown in FIG. 1A, the key labeled "A S" is one of several alphabetic keys of keyfield area 650 that may be selected. A user can make such a selection by actuating the key by contacting or pressing the key. The selection of the key results in the communication of electronic data representative of that fact to the microprocessor 338 which has a software program to identify the contacted input key. The microprocessor 338 with a software program configured to run thereon, will then show on the display screen 322 of the display area 222 the characters associated with the input key; in this case, "A" and "S." Both characters can be displayed such that one is already selected or signified, for example by highlighting. A user may select the other of the displayed characters by uninterrupted sweeping contact motion in the direction toward the alternative character shown on the display screen 322. The direction is preferably left or right, but may be up or down, diagonal, or any other direction which allows the user to navigate between the displayed alphabetic character choices. The selection of a desired alphabetic character can be made by stopping the uninterrupted sweeping contact motion when the desired character is highlighted on the screen 322. For example, if after the sweeping motion, the highlight has moved from the "A" character and stopped on the "S" character, then the S character has been selected. Alternatively, selection can be affected by disengagement from the keypad after such a sweeping motion is executed. The software program can be programmed to select one of the plurality of words displayed by the disambiguation routine in dependence upon where the uninterruptedly sweeping motion across the capacitance sensitive sheet stops and coincident disengagement of the uninterruptedly sweeping motion away from the capacitance sensitive sheet occurs. Optionally, any key, or a predetermined key can be pressed after the sweeping motion to designate a desired selection.

Figure 7A:
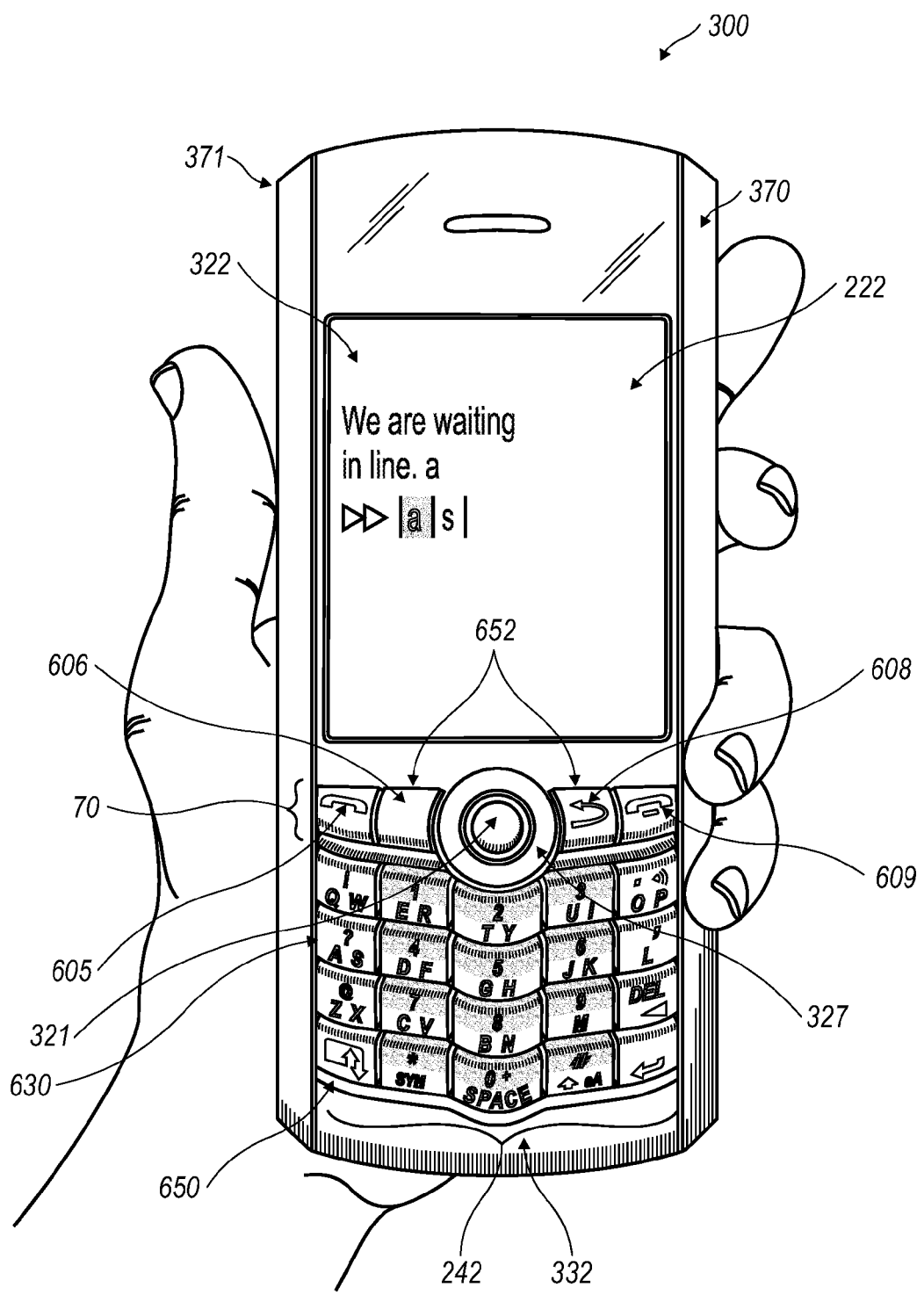
FIG. 7A illustrates an exemplary selection of alphabetic characters.
Figure 7B:
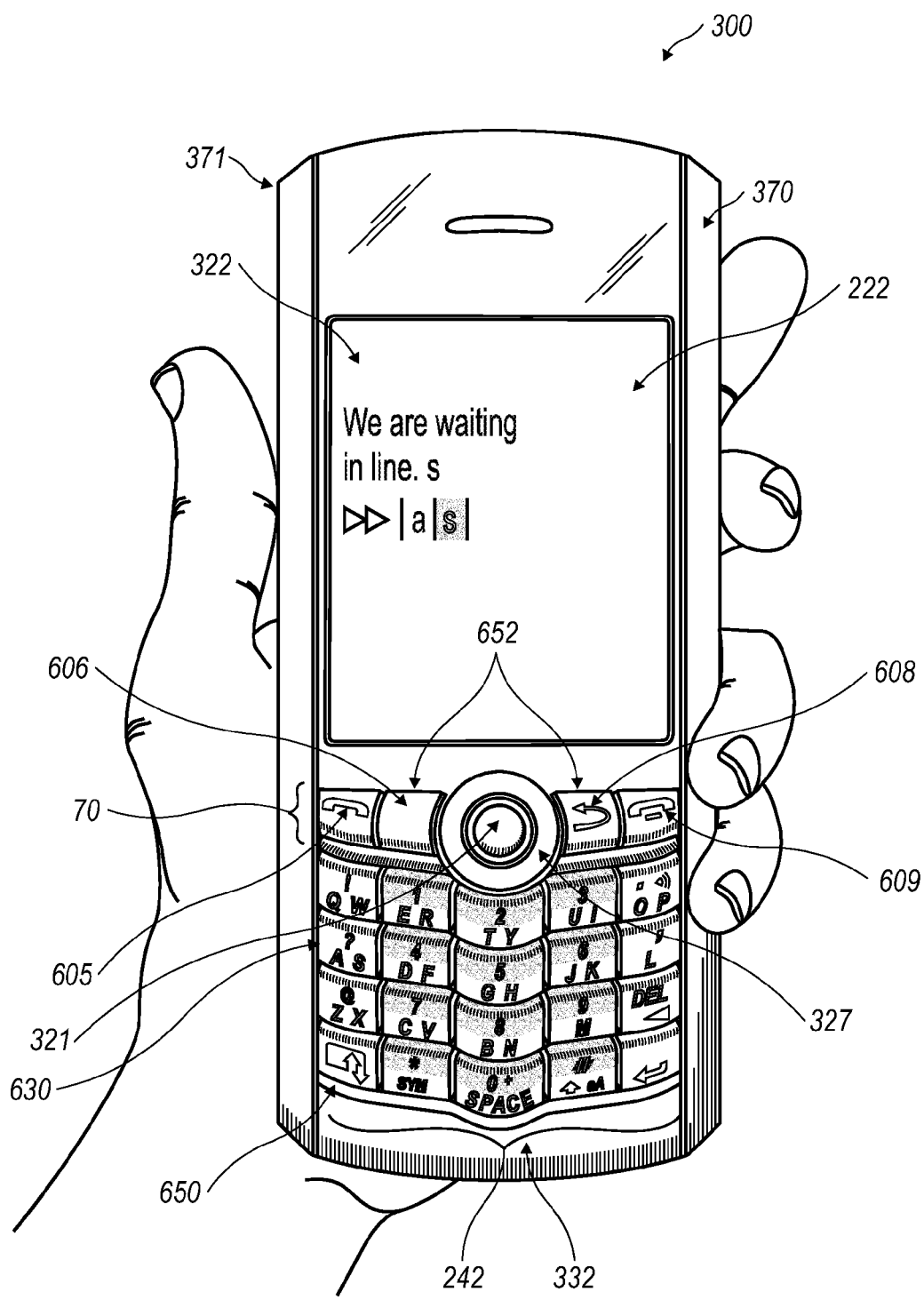
FIG. 7B illustrates another exemplary selection of alphabetic characters.
Figure 7C:
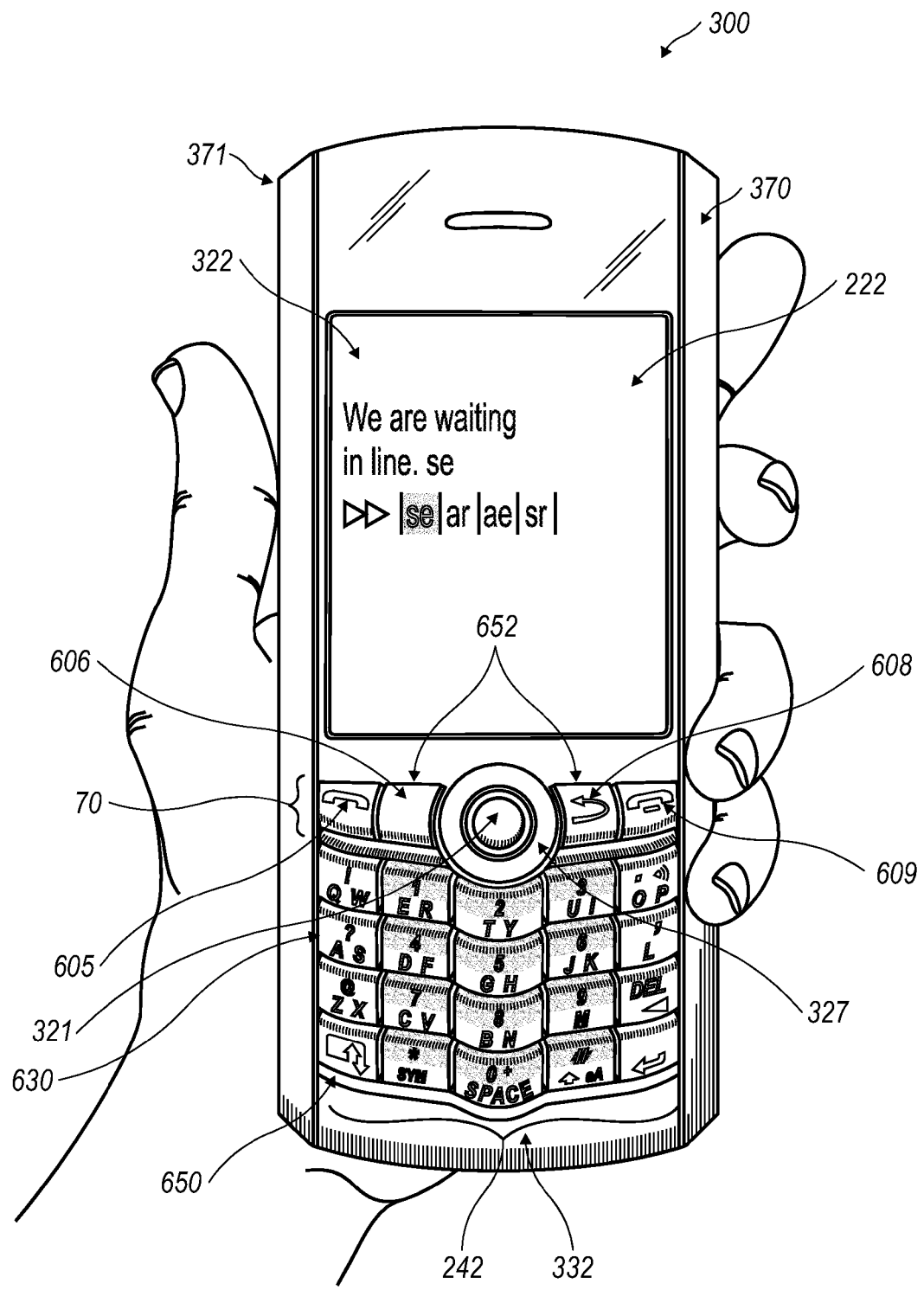
FIG. 7C illustrates yet another exemplary selection of alphabetic characters.
Figure 7D:
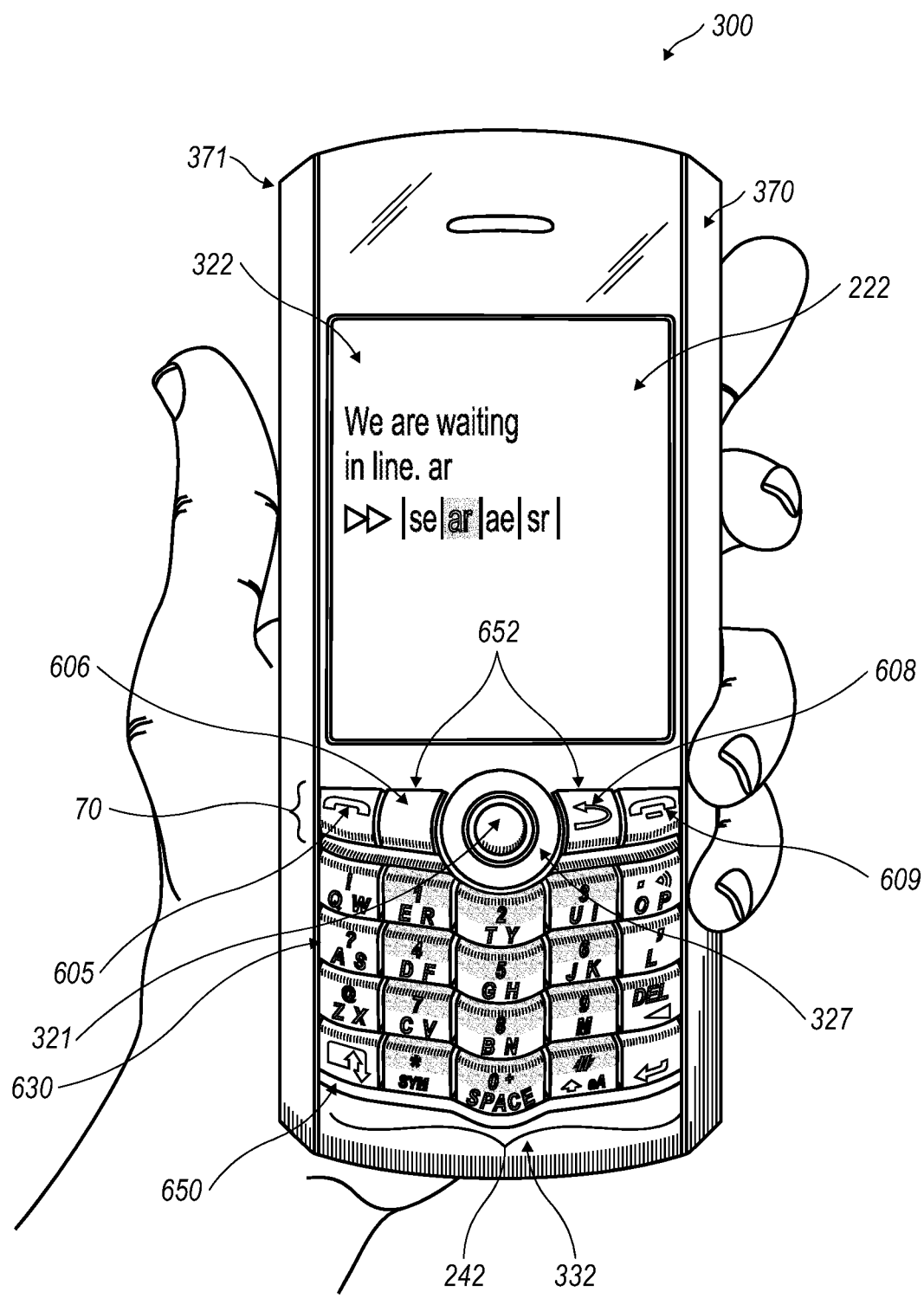
FIG. 7D illustrates still another exemplary selection of alphabetic characters.

As shown in FIG. 7B, after a selection is made, a software routine can propose further combinations of characters, or words which can also be selected by sweeping contact motion by the user. For example, if after making the selection of an "A" on the display, the user may contact the input key with characters "E R" assigned thereto as shown in FIG. 1A. After contacting or pressing this key, the microprocessor can receive this input and thereafter display several sets of character combinations. For example, it may display "se", "sr", "ar", and "ae" as shown in FIGS. 7C and 7D. The user may then use the sweeping contact motion across the cursor navigation area 72 to navigate between the proposed choices and make a selection.

Figure 7E:
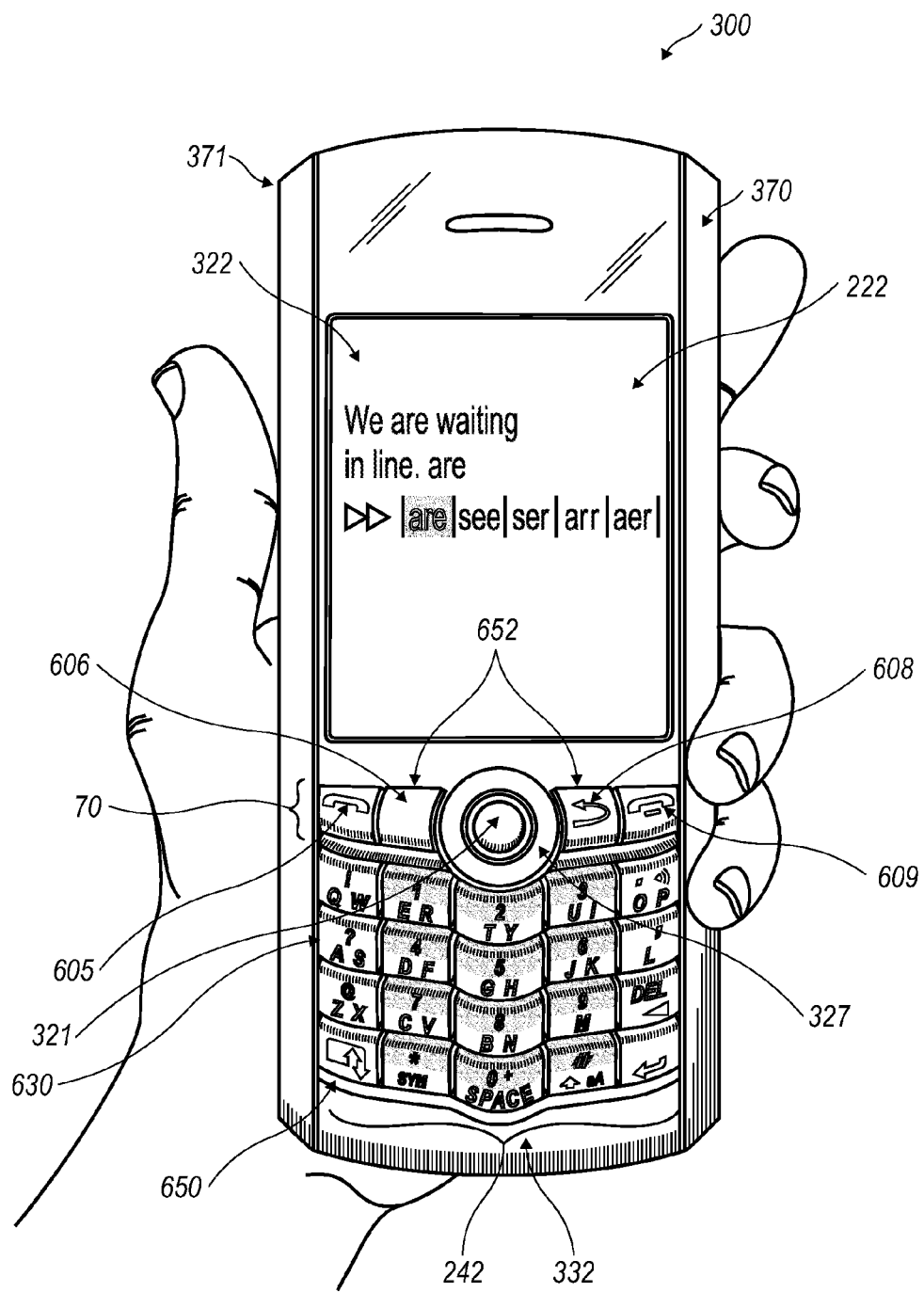
FIG. 7E illustrates another exemplary selection of words and/or alphabetic character combinations.

Additionally, as shown in FIG. 7E, a disambiguation routine, or predictive text software can be employed as well to aid selection of a desired word or character combination by the user. Proposed words or character combinations can be shown on the display with the characters or character combinations already selected. For example, after actuating keys "A S" and "E R", there may be displayed, in addition to "se", "sr", "ar", and "ae", also the words "see" and "are" on the display screen 322. The manner in which the various characters and character combinations are displayed is not limited. There may be any arrangement which is convenient for display and selection.

Figure 8A:
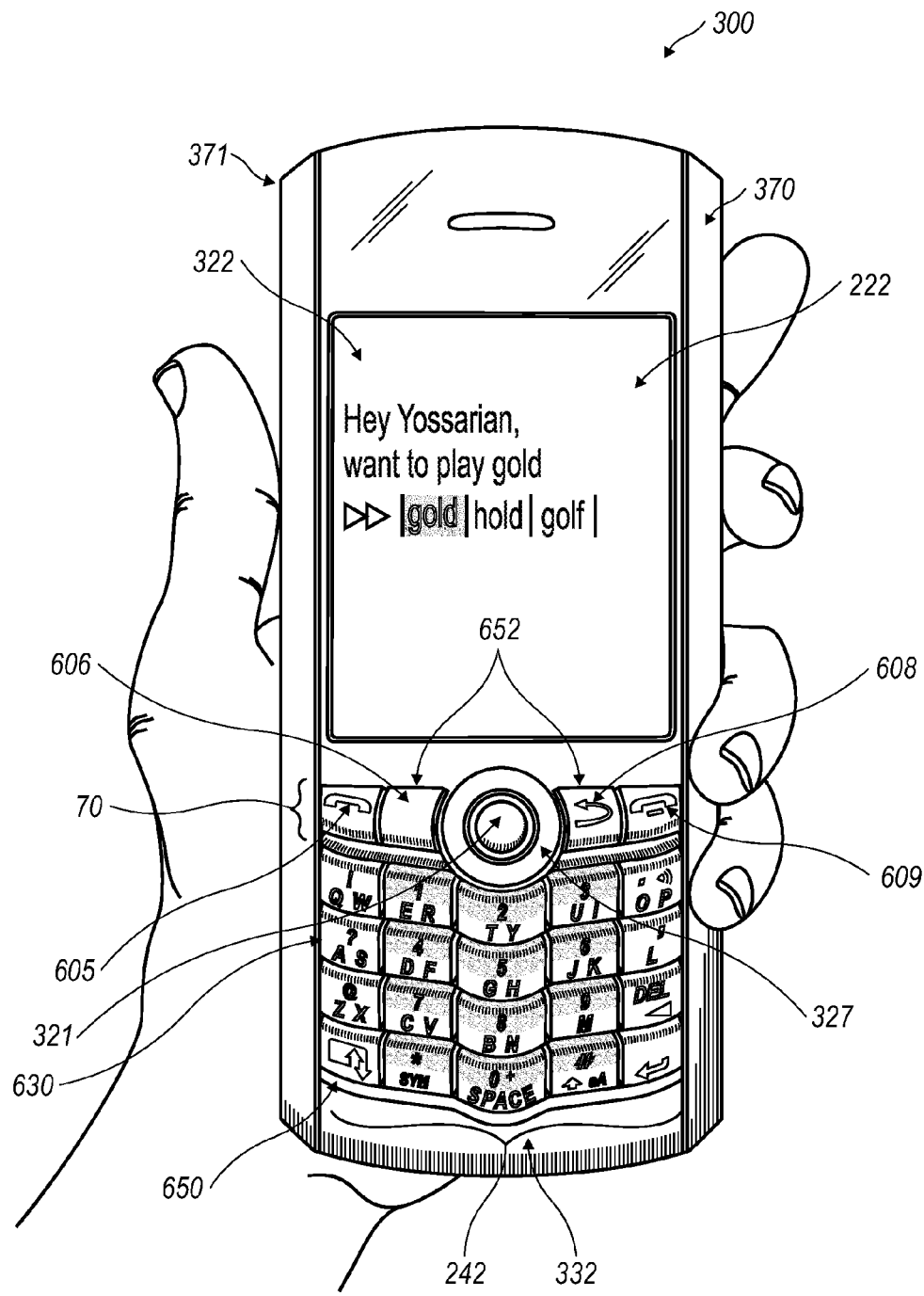
FIG. 8A illustrates an exemplary correction of words and/or alphabetic character combinations.
Figure 8B:
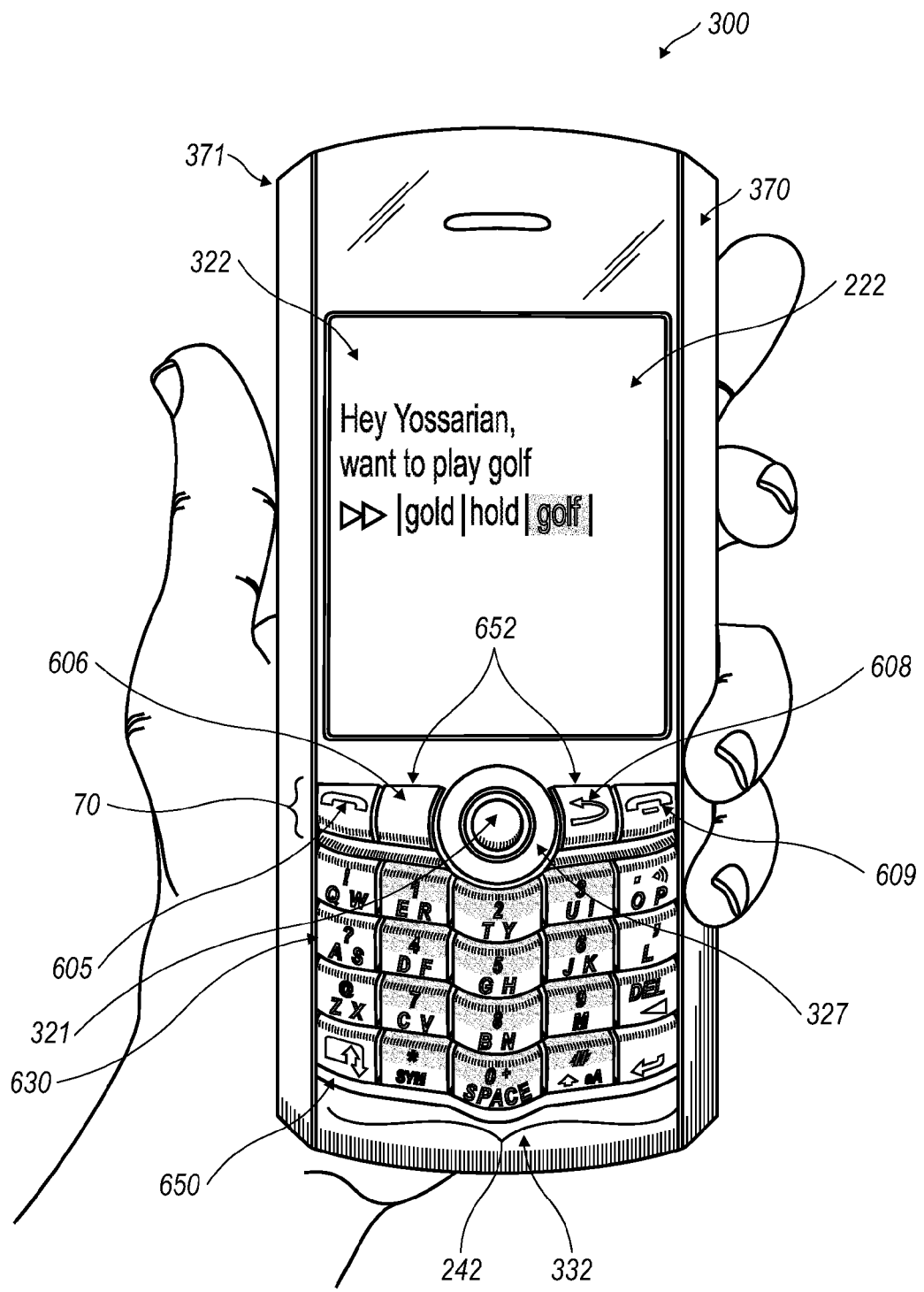
FIG. 8B illustrates an exemplary correction of words and/or alphabetic character combinations.

In another embodiment and as shown in FIGS. 8A and 8B, a user may employ the cursor navigation area 72 in order to make word corrections. For example, if a user actuates keys in the following sequential order "G H", "O P", "L", "D F" and then the space bar. Once the space bar is pressed, the word "gold" may appear in the display 222. If this is not the desired word, the user can make a sweeping contact motion to the left or right. The microprocessor 338 then receives an input that the sweeping contact motion was conducted. A software routine can then be activated wherein a list of proposed words may be shown on the display 322. For Example, the list of proposed words may be "hold" and "golf", and optionally include "gold." The user, by executing a sweeping contact motion in the navigation area 72, can navigate through the list of words and make the desired selection. The direction of the movement of the sweeping contact motion is not limited; the direction may be up or down, left or right, diagonal or any other cursor guidance course. Furthermore the proposed words may be shown to the left or right, or above or below, or in other areas of the display, or in any manner which facilitates navigation and selection of a word by the user.

The sweeping contact motion made by the user in one embodiment can begin from the key where the last selection was made. For example, if the key with "A S" was last selected, the sweeping movement and navigation can begin from that key. In other embodiments, the sweeping contact motion and navigation can begin from any other key in the cursor navigation area 72

The arrangement and construction of the alphabetic keys 630 can be according to the above description. Furthermore, in at least one embodiment each of the alphabetic keys 630 is a physically depressible key which is overlaid or underlaid with a separate navigation pad which is able to detect movement of a finger across the keypad. In another embodiment, virtual keys on a display or keypad may also serve as the navigation pad. In yet another embodiment, each of the alphabetic keys 630 is depressible keys with a touch sensitive top surface. The cursor navigation area 72 is coincident with (overlies or underlays, for example) the navigation pad or the touch sensitive top surface. This enables the movement of the finger across the keypad to be detected and input to the microprocessor.

In an exemplary embodiment, a computer program is configured to run on a microprocessor 338 in the handheld electronic communication device 300, and distinguish between desired cursor navigation or text entry on the handheld electronic communication device 300. The computer program can be programmed to receive data indicative of a detected sweeping contact motion across the cursor navigation area 72 at the front face of the device. This cursor navigation area 72 is located coincidentally with at least a portion of a plurality of alphabetic keys on the front face. The device 300 further includes a display screen 322 of the display area 222 located above the keyfield area 650. Furthermore, the microprocessor 338 is communicatively connected between the cursor navigation area 72 and the keyboard and communicatively connected between the display screen 322 of the display area 222. The microprocessor 338 may be further programmed to receive cursor guidance instructions via the cursor navigation area 72 and to cause cursor movement on the display screen 322 of the display area 222 in correspondence with the detected sweeping contact motion across the cursor navigation area 72. In a further embodiment, the computer program is programmed to receive data that is indicative of a detected initial contact with an alphabetic key 630. Additionally, the microprocessor 338 may be programmed to receive key-selection instructions via the keyfield and be further programmed to cause at least one corresponding letter associated with the contacted key to be displayed on the display screen 322 of the display area 222.

Figure 9:
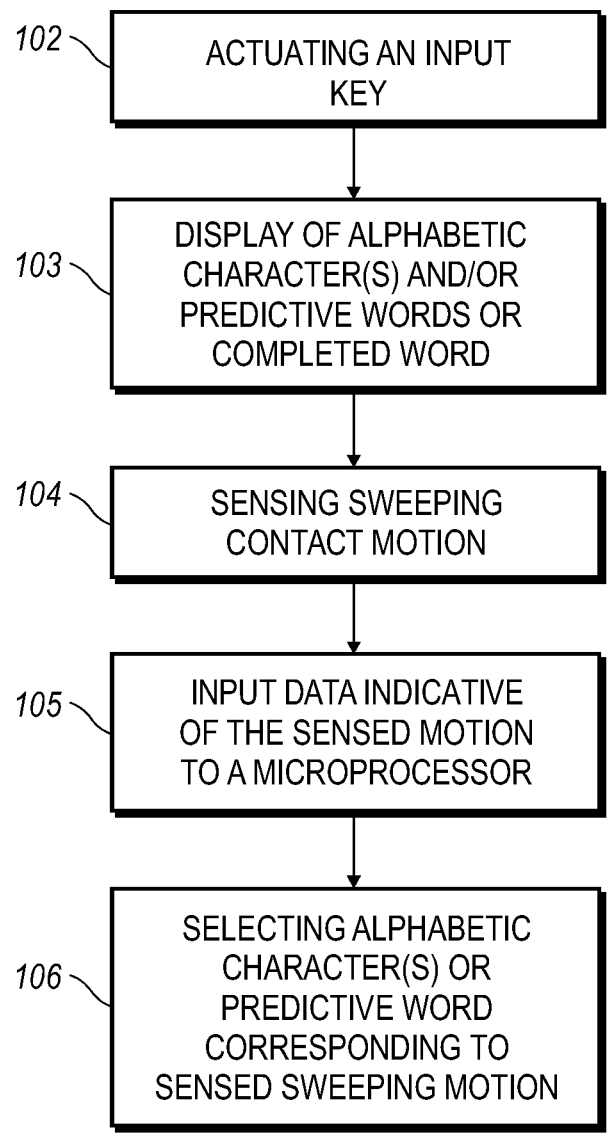
FIG. 9 is a flow chart illustrating an exemplary selection of alphabetic characters, combinations, and words.

In at least one embodiment and as illustrated in FIG. 9, a method is disclosed for executing cursor navigation for character entry on a handheld electronic communication device 300. In the case of cursor navigation, the method can first involve actuation of an input key by a user, as shown in block 102. Thereafter, as shown in block 103, alphabetic character (s) or words can be displayed on the display screen 322. If the user is in the process of completing a word, then various predictive words or character combinations can be displayed. Alternatively, the user may have just completed a word, and this word is therefore displayed for the user. A user can then make a sweeping contact motion initiated at the key which was pressed last or any other key (block 104). This sweeping contact motion continues across a cursor navigation area 72 located coincidentally with at least a portion of a plurality of alphabetic keys on a front face 370 of the device 300. The method detects the sweeping contact motion across the cursor navigation area 72 by one of the above described devices or means or combinations thereof. Data indicative of this detected motion is inputted to a microprocessor 338 that is communicatively connected between the cursor navigation area and the display screen 322 of the display area 222 (block 105). If the user is interested in completing a word or correcting a word, the user employs the sweeping motion to navigate from among the displayed predictive characters or words to make a selection corresponding with the detected sweeping contact motion that occurs across the cursor navigation area 72 (block 106).

Exemplary embodiments have been described hereinabove regarding both handheld wireless communication devices 300, as well as the communication networks 319 within which they operate. Again, it should be appreciated that the focus of the present disclosure is providing an apparatus and methodology for navigating through alphabetic characters and words for selection by the user. Various modifications to and departures from the disclosed embodiments will occur to those having skill in the art. The subject matter that is intended to be within the spirit of this disclosure is set forth in the following claims.

What is claimed is:

1. A handheld electronic device, comprising:
a body comprising:
a display area;
a cursor navigation area; and
a keyfield area comprising:
a reduced keyboard comprising a plurality of input keys, at least a portion of said input keys each having a plurality of alphabetic characters associated therewith; and
a microprocessor communicatively connected between said input keys and a display screen of the display area and communicatively connected between the cursor navigation area and the display screen, said microprocessor configured to:
receive input data indicative of a detected contact with a particular input key having a plurality of alphabetic characters associated therewith;
identify the particular input key associated with the detected contact;
in response to identifying the particular input key, determine at least one of a plurality of associated alphabetic characters associated with the identified particular input key using a disambiguation software;
display at least two associated alphabetic characters corresponding with the identified particular input key;
determine that the detected contact uninterruptedly continues as sweeping motion from the identified particular input key across to the cursor navigation area;
determine where the uninterruptedly sweeping motion across the cursor navigation area stops; and
in response to determining where the uninterruptedly sweeping motion stops, select one of the at least two associated alphabetic characters corresponding to where the uninterruptedly sweeping motion stops.

2. The handheld electronic communication device as recited in claim 1, wherein at least a portion of the cursor navigation area is coincidently located relative said input keys.

3. The handheld electronic communication device as recited in claim 1, wherein the cursor navigation area is defined by a capacitance sensitive sheet capable of sensing sweeping motion executed proximate thereto.

4. The handheld electronic communication device as recited in claim 3, wherein the capacitance sensitive sheet is located beneath the keyfield area.

5. The handheld electronic communication device as recited in claim 3, wherein the capacitance sensitive sheet is overlaid atop the keyfield area.

6. The handheld electronic communication device as recited in claim 3, wherein each of the input keys is a physically depressible key.

7. The handheld electronic communication device as recited in claim 3, wherein said software program is further programmed to select one of the plurality of displayed alphabetic characters in dependence upon where uninterruptedly sweeping motion across the capacitance sensitive sheet stops and coincident disengagement away from said capacitance sensitive sheet occurs.

8. The handheld electronic communication device as recited in claim 7, wherein the alphabetic characters associated with the input keys are letters that in the aggregate, are arranged in a QWERTY order.

9. The handheld electronic communication device as recited in claim 3, wherein said software program is further programmed to select one of the plurality of words displayed by the disambiguation software routine in dependence upon where uninterruptedly sweeping motion across the capacitance sensitive sheet stops and coincident disengagement away from said capacitance sensitive sheet occurs.

10. The handheld electronic communication device as recited in claim 1, wherein each of the input keys is a physically depressible input key having a contact-sensitive top surface.

11. The handheld electronic communication device as recited in claim 1, wherein the keyfield area and the cursor navigation area share a common capacitance sensitive sheet for sensing input key contacts and sweeping motion executed proximate said capacitance sensitive sheet.

12. The handheld electronic communication device as recited in claim 1, wherein the keyfield area and the cursor navigation area share a common capacitance sensitive sheet for sensing input key contacts and sweeping motion executed proximate said capacitance sensitive sheet and each of said input keys being a virtual, non-depressible key visually defined on said common capacitance sensitive sheet.

13. A method for operating a disambiguation routine on a handheld electronic communication device, said method comprising:
receiving, at the handheld electronic communication device, input data indicative of a detected contact with a particular input key of a reduced keyboard on the handheld electronic communication device, wherein the particular input key has a plurality of alphabetic characters associated therewith;
identifying the particular input key associated with the detected contact;
in response to identifying the particular input key, determining at least one of a plurality of associated alphabetic characters associated with the identified particular input key using the disambiguation software;
displaying the plurality of associated alphabetic characters corresponding with the identified particular key on a display screen of the handheld electronic device;
determining that the detected contact uninterruptedly continues as sweeping motion from the identified particular input key across to the cursor navigation area;
determining where the uninterruptedly sweeping motion across the cursor navigation area stops; and
in response to determining where the uninterruptedly sweeping motion stops, selecting one of the plurality of associated alphabetic characters corresponding to where the uninterruptedly sweeping motion stops.

14. The method as recited in claim 13, wherein at least a portion of the cursor navigation area is coincidently located relative said input keys.

15. The method as recited in claim 13, wherein the cursor navigation area is defined by a capacitance sensitive sheet capable of sensing sweeping motion executed proximate thereto.

16. The method as recited in claim 15, wherein the capacitance sensitive sheet is located beneath the keyfield area.

17. The method as recited in claim 15, wherein the capacitance sensitive sheet is overlaid atop the keyfield area.

18. The method as recited in claim 15, wherein each of the input keys is a physically depressible key.

19. The method as recited in claim as recited in claim 15, wherein said software program is further programmed to select one of the plurality of displayed alphabetic characters in dependence upon where uninterruptedly sweeping motion across the capacitance sensitive sheet stops and coincident disengagement away from said capacitance sensitive sheet occurs.

20. The method as recited in claim as recited in claim 19, wherein the alphabetic characters associated with the input keys are letters that in the aggregate, are arranged in a QWERTY order.

21. The method as recited in claim as recited in claim 15, wherein said software program is further programmed to select one of the plurality of words displayed by the disambiguation software routine in dependence upon where uninterruptedly sweeping motion across the capacitance sensitive sheet stops and coincident disengagement away from said capacitance sensitive sheet occurs.

22. The method as recited in claim 13, wherein each of the input keys is a physically depressible input key having a contact-sensitive top surface.

23. The method as recited in claim 13, wherein the keyfield area and the cursor navigation area share a common capacitance sensitive sheet for sensing input key contacts and sweeping motion executed proximate said capacitance sensitive sheet.

24. The method as recited in claim 13, wherein the keyfield area and the cursor navigation area share a common capacitance sensitive sheet for sensing input key contacts and sweeping motion executed proximate said capacitance sensitive sheet and each of said input keys being a virtual, non-depressible key visually defined on said common capacitance sensitive sheet.

25. A non-transitory computer-readable medium storing computer executable instructions for execution by a microprocessor of an electronic device, the non-transitory computer-readable medium storing executable instructions that when executed by the microprocessor control the handheld electronic device to:

receive, at the handheld electronic communication device, input data indicative of a detected contact with a particular input key of a reduced keyboard on the handheld electronic communication device, wherein the particular input key has a plurality of alphabetic characters associated therewith;

identify the particular input key associated with the detected contact;

in response to identifying the particular input key, determine at least one of a plurality of associated alphabetic characters associated with the identified particular input key using a disambiguation software;

display the plurality of associated alphabetic characters corresponding with the identified key on a display screen of the handheld electronic device;

determine that the detected contact uninterruptedly continues as sweeping motion from the identified particular input key across to the cursor navigation area;

determine where the uninterruptedly sweeping motion across the cursor navigation area stops; and in response to determining where the uninterruptedly sweeping motion stops, select one of the plurality of associated alphabetic characters corresponding to where the uninterruptedly sweeping motion stops.

26. The non-transitory computer-readable medium as recited in claim 25, wherein at least a portion of the cursor navigation area is coincidently located relative said input keys.

27. The non-transitory computer-readable medium as recited in claim 25, wherein the cursor navigation area is defined by a capacitance sensitive sheet capable of sensing sweeping motion executed proximate thereto.

28. The non-transitory computer-readable medium as recited in claim 27, wherein the capacitance sensitive sheet is located beneath the keyfield area.

29. The non-transitory computer-readable medium as recited in claim 27, wherein the capacitance sensitive sheet is overlaid atop the keyfield area.

* * * * *